United States Patent [19]

Tabata

[11] 4,309,627

[45] Jan. 5, 1982

[54] DETECTING CIRCUIT FOR A POWER SOURCE VOLTAGE

[75] Inventor: Junichi Tabata, Tokyo, Japan

[73] Assignee: Kabushiki Kaisha Daini Seikosha, Tokyo, Japan

[21] Appl. No.: 24,441

[22] Filed: Mar. 27, 1979

[30] Foreign Application Priority Data

Apr. 14, 1978 [JP] Japan .................................. 53-43907
Apr. 14, 1978 [JP] Japan .................................. 53-43908

[51] Int. Cl.³ ..................... H03K 5/24; H03K 17/30; G08B 21/00
[52] U.S. Cl. ................................. 307/362; 307/297; 340/636; 368/66
[58] Field of Search ................... 307/362, 304, 297; 340/636, 663; 368/10, 66

[56] References Cited

U.S. PATENT DOCUMENTS

| | | | |
|---|---|---|---|
| 3,806,742 | 4/1974 | Powell | 307/297 X |
| 3,943,380 | 3/1976 | Morgan et al. | 307/362 |
| 4,024,415 | 5/1977 | Matsuura | 368/66 X |
| 4,096,430 | 6/1978 | Waldron | 307/297 X |
| 4,100,437 | 7/1978 | Hoff, Jr. | 307/297 |
| 4,128,816 | 12/1978 | Shimotsuma | 307/297 X |
| 4,140,930 | 2/1979 | Tanaka | 307/362 |
| 4,160,176 | 7/1979 | Takahashi | 340/663 X |
| 4,215,281 | 7/1980 | Chao | 307/362 X |
| 4,217,535 | 8/1980 | Suzuki et al. | 340/636 X |
| 4,224,539 | 9/1980 | Musa et al. | 307/362 |

FOREIGN PATENT DOCUMENTS

52-21870  2/1977  Japan .................................. 307/362

*Primary Examiner*—Larry N. Anagnos
*Attorney, Agent, or Firm*—Robert E. Burns; Emmanuel J. Lobato; Bruce L. Adams

[57] ABSTRACT

A detecting circuit for a power source voltage comprises a reference voltage generating circuit for generating a reference voltage, a voltage dividing circuit for dividing the power source voltage, and a voltage comparing circuit having one input terminal connected to receive the reference voltage from the reference voltage generating circuit and another input terminal connected to receive the divided voltage from the voltage dividing circuit. In one embodiment, the reference voltage generating circuit comprises at least two MOS-transistors having different threshold voltages and having the same polarity, one of the MOS-transistors having its gate and drain connected together with the drain being connected to the gate of the other MOS-transistor, the drain and source of the other MOS-transistor each being connected to a resistor, and the drain of the other MOS-transistor being connected to one input terminal of the voltage comparing circuit. In another embodiment, the reference voltage generating circuit comprises a P-channel MOS-transistor having its drain connected to the drain of the N-channel MOS-transistor and the gates of the P-channel and N-channel MOS-transistors being connected to the drains thereof respectively, one of the MOS-transistors being connected to one terminal of the power source, and the other of the MOS-transistors being connected to one input terminal of the voltage comparing circuit.

4 Claims, 7 Drawing Figures

DETECTING CIRCUIT FOR A POWER SOURCE VOLTAGE

BACKGROUND OF THE INVENTION

This invention relates to a detecting circuit for a power source voltage which is composed of a reference voltage generating circuit, a divider circuit for the power source voltage and a voltage comparing circuit.

In the conventional type, a small type mercury battery is employed as an energy source for powering small electronic equipment such as electronic timepieces and calculators. This type of mercury battery must be able to generate about 1.6 Volts and to constantly maintain a constant voltage for a long time, however, with such batteries the voltage suddenly falls after elapse of certain time. Accordingly, it is necessary to detect the battery voltage and to change the battery before its voltage suddenly drops causing instability of the operation of the electronic equipment. In the conventional detecting circuit for a power source voltage, many circuits have been developed such as shown in FIGS. 1 to 3. These prior art circuits are composed of a combination of MOS-transistor and resistor whereby they can be easily fabricated using known integrated circuit techniques. However, irregularities in the electro-conductive coefficient or voltage threshold of the MOS-transistor and in the resistance value of the diffusion resistance are caused during the fabrication process of the IC. As means for eliminating such irregularities, it is necessary to utilize an outer electronic part for adjusting the battery life detecting voltage "Ej". Actually, one resistor in the circuit is employed as the outer electronic part thereof.

The use of outer electronic parts is very disadvantageous from the standpoint of designing very small electronic equipment such as an electronic wrist watch and calculator, particularly since in small electronic equipment it is desirable that all of the electronic parts thereof are completely made by IC-construction. Further, the working process for adjusting the resistance and aligning the battery life detecting voltage "Ej" is very difficult and result in a higher cost.

SUMMARY OF THE INVENTION

The present invention aims to eliminate the above noted difficulty and insufficiency and such is achieved by providing a pair of MOS-transistors connected in parallel and having the same polarity with the threshold voltage "Vth" of the MOS-transistors being different from each other.

A further object of the present invention is to provide no irregularity in the "Vth" characteristic of the MOS-transistors by using different "Vth" characteristics of the MOS-transistors. This object of the present invention is to provide a stability of temperature characteristic and to enable making all of the circuit construction by IC, whereby it is able to provide a voltage detecting circuit having a good temperature characteristic and which is of the non-adjusting type.

Another object of the present invention is to provide a pair of MOS-transistors connected in series and having different polarities. This object of the present invention is to provide no irregularity of the "Vth" characteristic of the MOS-transistors by using a sum of the "Vth" characteristic of the MOS-transistors.

BRIEF DESCRIPTION OF THE DRAWINGS

The above mentioned and further objects, features and advantages of the present invention will become more apparent from the following description when taken in connection with the accompanying drawings, which show one preferred embodiment and another preferred embodiment of the present invention and wherein.

DETAILED EXPLANATION OF THE INVENTION

Figure 1:
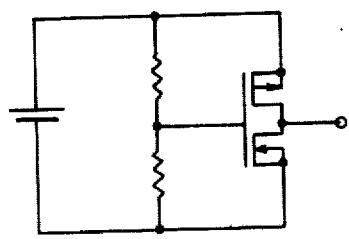
FIG. 1 shows a conventional circuit.
Figure 2:
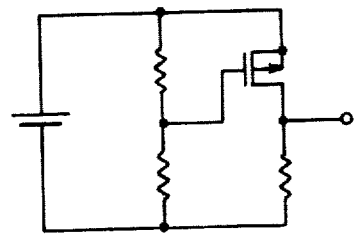
FIG. 2 shows another type conventional circuit.
Figure 3:
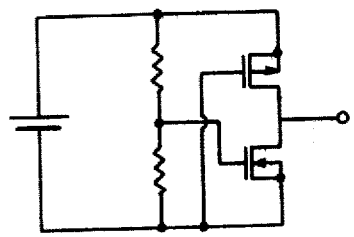
FIG. 3 shows a further type conventional circuit.
Figure 4:
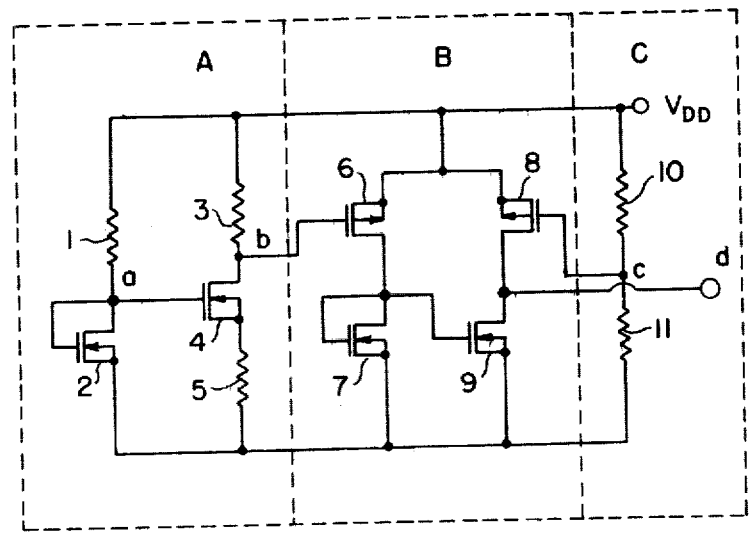
FIG. 4 shows a principle circuit construction of one embodiment of the present invention.

FIG. 4 shows a circuit construction for explaining the basic principle of one embodiment of the present invention. The A-block diagram in the drawing is a reference voltage generating circuit composed of a resistor 1, resistor 3, resistor 5, N-channel MOS-transistor 2 and N-channel MOS-transistor 4. The N-channel transistors 2 and 4 have different threshold voltages "Vth", namely, the threshold voltage of N-channel transistor 2 is "Vth", and the threshold voltage of N-channel transistor 4 is "V'th", these "Vth" and "V'th" are controlled in the manufacturing process of the IC. Namely, the manufacturing process of N-channel transistors having different threshold voltages is executed by a channel-doping process according to implanting "P+ion". The relation between the threshold voltages is Vth > V'th.

If the voltage of a connection point "a" of N-channel transistor 2 and the resistor 1 is "Va", $$Va = \frac{2\gamma_1 Vtn - 1 \pm \sqrt{4\gamma_1(Vdd - Vtn) + 1}}{2\gamma_1} \quad (1)$$

$\alpha_1$: $R_1 KN_2$;

Vtn: threshold voltage of transistor 2;

$R_1$: resistance value of resistor 1;

$KN_2$: electro-conductive coefficient of transistor 2;

Vdd: power source voltage.

said "$\alpha_1$" is designed so that $$"Va = Vtn" \quad (2)$$

If the voltage of a connection point "b" of N-channel transistor 4 and the resistor 3 is "Vb", $$Vdd - Vb = \frac{R_3}{R_5} \left\{ Vth - V'th + \frac{1}{2K_4R_5} \pm \sqrt{\left(\frac{1}{2K_4R_5}\right)^2 + \frac{Vth - V'th}{K_4R_5}} \right\} \quad (3)$$

$R_3$: resistance value of resistor 3;
$R_5$: resistance value of resistor 5;
Vtn: threshold voltage of transistor 2;
V'tn: threshold voltage of transistor 4;
$K_4$: electro-conductive coefficient of transistor 4.
If "$K_4R_5$" in said formula (3) is large in value, then $$Vdd - Vb = R_3/R_5 (Vtn - V'tn) \quad (4)$$

"Vtn−V'tn" is the difference between the different threshold voltages of two transistors having the same polarity which can be made on one wafer. The threshold voltages are controlled by ion implantation so that the irregularity of the designed value is very small and the temperature coefficient is zero. As to a cause for suppressing the irregularity, the irregularity of the impurity concentration of the base plate and effect of surface charge equally affect "Vtn and V'tn" on the wafer, and these irregularites are eliminated by using the difference between "Vtn and V'tn". Similarly, the temperature coefficients of "Vtn" and "V'tn" are almost equal whereby the temperature coefficient of Vtn−V'tn becomes zero by using the difference between both of the temperature coefficients.

It is possible to make the resistors 3 and 5 in an IC as a diffusion resistor, the resistance value thereof being determined by a sheet resistance value and a geometrical dimension so that the resistance ratio "$R_3/R_5$" has no irregularity and no temperature change whereby it is possible to constantly design the resistor. Therefore, as to irregularity and temperature change, $$R_3/R_5 (Vtn - V'tn) = constant$$

"$V_{DD}$−Vb" can thus be employed as a reference voltage "Vs".

The B-block diagram is a voltage comparing circuit which is composed of P-channel MOS-transistors 6 and 8 and N-channel MOS-transistors 7 and 9. The voltage comparing circuit has two input terminals, a gate terminal of P-channel transistor 6 as one input terminal is connected to a reference voltage generating point "b", and a gate terminal of P-channel transistor 8 as another input terminal is connected to a connection point "c" of resistors 10 and 11.

The C-block diagram in the drawing is a dividing circuit of the power source voltage which is composed of the resistors 10 and 11 which are connected in series relation to each other. The voltage "Vc" of power source voltage "Vdd" at a connection point "c" between the resistors 10 and 11 is as follows:

$$Vc = R_{10}/(R_{11} + R_{10}) \times V_{DD} \quad (5)$$

$R_{10}$: resistance value of resistor 10;
$R_{11}$: resistance value of resistor 11.
According to the above noted formula (5), "Vc" is proportional to the power source voltage whereby it is able to check any fluctuation of the power source voltage. Further it is possible to make the resistors 10 and 11 as a diffusion resistor of an IC so that the resistance value thereof is determined by the sheet resistance value and the geometrical dimension, the temperature coefficients thereof are equal respectively, and the resistance ratio ($R_{11}/R_{10}+R_{11}$) has no irregularity whereby the temperature coefficient is zero. Therefore, "Vc" is able to precisely transmit any voltage fluctuation according to a temperature change and a capacitance change of the power source.

Referring now to the operation of the B-block diagram and C-block diagram in the drawing:

The voltage at point "c" when the power source voltage falls to the battery life detection voltage "Ej", i, e, "Vdd"=Ej is "VcEj", and the relation between "VcEj" and the reference voltage "Vs" of the A-block diagram is designed so as to satisfy the following formula:

$$VcEj = R_3/R_5(Vtn - V'tn) \quad (6)$$

As a means for satisfying the above noted formula (6), it is possible to control the amount of ion implantation for determining the threshold voltage "V'tn" of the N-channel transistor or to freely control each of the resistance values of resistors 3, 5, 10 and 11.

According to the above noted design, the relation between "Vc" and reference voltage "Vs" is as follows:
(1) In case of Vdd>Ej Vs<Vc;
(2) In case of Vdd=Ej Vs=Vc;
(3) In case of Vdd<Ej Vs>Vc.

The following table −1 shows the output signals of the voltage comparing circuit in which "Vc" and the reference voltage "Vs" are applied thereto as input signals:

TABLE 1

| Relation of 2 inputs | Output logic level |
|---|---|
| Vs < Vc | "H" |
| Vs = Vc | "L" |
| Vs > Vc | "L" |

According to TABLE −1, the output signal of the voltage comparing circuit is "H" level in case the power source voltage "$V_{DD}$" is larger than the battery life detecting voltage "Ej", the output signal of the voltage comparing circuit is "L" level in case the power source voltage "$V_{DD}$" is equal to the battery life detecting voltage "Ej" or is smaller than the battery life detecting voltage "Ej", whereby the output signal of the power source voltage detecting circuit is generated to the terminal "d".

According to the present invention, the voltage detecting circuit is able to eliminate the influence of irregularity of the characteristics of the resistor and both of the transistors in the IC manufacturing process in the reference voltage generating circuit and the power source voltage dividing circuit. Further it is able to make remarkably small the temperature coefficient of the circuit whereby it is possible to obtain a stable operating characteristic in a wide temperature range, and it is not necessary to utilize outer electronic parts for adjusting the voltage detecting circuit. Therefore it is possible to completely make the voltage detecting circuit by IC-construction.

Figure 5:
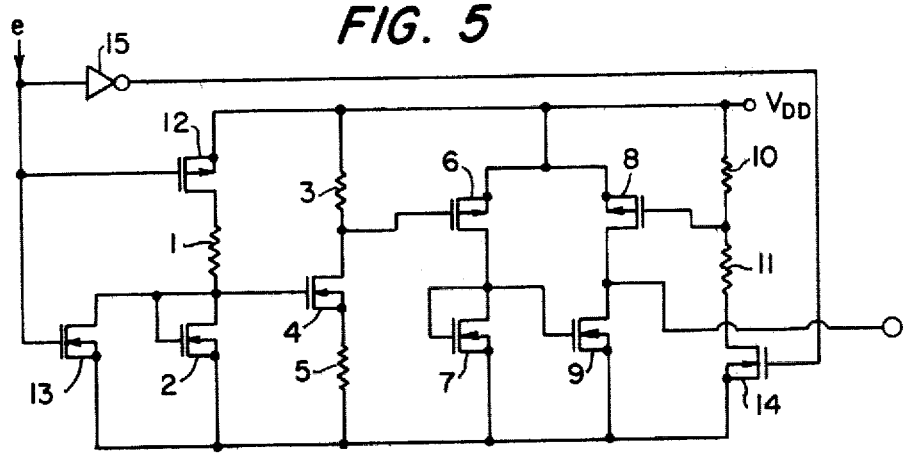
FIG. 5 shows one embodiment of the present invention wherein the A-block diagram is a reference voltage generating circuit, the B-block diagram is a voltage comparing circuit, and the C-block diagram is a power source voltage dividing circuit.

The foregoing discussion explained the principle of the present invention, and in the actual circuit, the circuit is designed so as to be only operated when a pulse having a certain period is applied thereto by inserting a switching element for reducing the power consumption thereof. FIG. 5 shows one example of such a circuit construction wherein a switching operation is executed by P-channel transistor 12 and N-channel transistors 13 and 14. A terminal "e" is a sampling pulse input terminal, and an inverter 15 switches N-channel transistor 14 by reversing a sampling pulse. A sampling operation is executed when a sampling signal becomes logic level "L" whereby the circuit operates as a power source voltage detecting circuit.

According to the present invention, a power source voltage detecting circuit of non-adjusting type is easily obtained, reducing the adjusting cost of the circuit using IC-construction thereby enabling a more easy design of small electronic equipment.

Further it is able to easily obtain a battery life detecting circuit which is able to be used in other equipment except watch.

Figure 6:
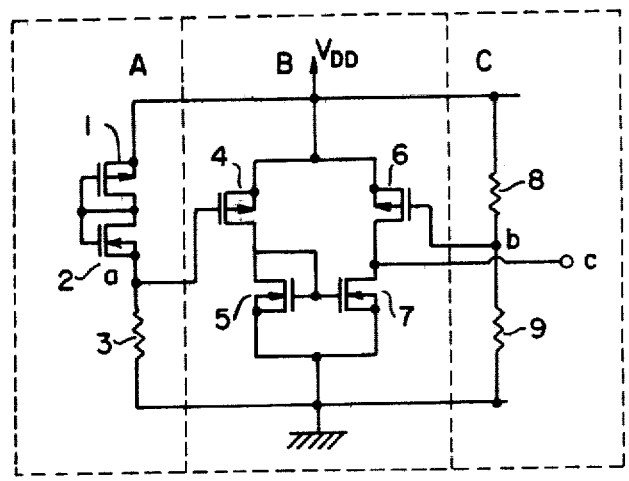
FIG. 6 shows a principle circuit construction of another embodiment of the present invention.

FIG. 6 shows a circuit construction for explaining a basic principle of a second embodiment of the present invention. The A-block diagram in the drawing is a reference voltage generating circuit composed of P-channel MOS-transistor 1, N-channel MOS-transistor 2 and resistor 3. A gate electrode of P-channel MOS-transistor 1 is connected to a drain electrode of the transistor 1, a gate electrode of N-channel MOS-transistor 2 is connected to a drain electrode of the transistor 2, and a gate electrode of P-channel MOS-transistor is connected to a gate electrode of N-channel MOS-transistor 2.

Referring now to the manner in which a reference voltage is generated at point "a" of the reference voltage generating circuit:

The voltage of point "a" in the reference voltage generating circuit of power source voltage "VDD" is "Vs", a voltage between the source and drain electrodes of P-channel MOS-transistor 1 is "Vdsp", therefore, the electric currents which pass P-channel MOS-transistor 1, N-channel MOS-transistor 2 and resistor 3 are as follows:

$$Ip = Kp\,(Vdsp - Vtp)^2 \quad [1]$$

$$In = Kn\,(Vs - Vdsp - Vtn)^2 \quad [2]$$

$$IR_3 = (Vdd - Vs)/R_3 \quad [3]$$

Ip: current of P-channel transistor 1;
In: current of N-channel transistor 2;
IR$_3$: current of resistor 3;
Kp: electro-conductive coefficient of P-channel transistor 1;
Kn: electro-conductive coefficient of N-channel transistor 2;
Vtp: threshold voltage of P-channel transistor 1;
Vtn: threshold voltage of N-channel transistor 2;
R$_3$: resistance value of resistor 3.

In the above noted three formulas, each of the currents are equal, erasing a variable "Vdsp", resolving about "Vs":

$$Vs - \sqrt{\frac{VDD - Vs}{Kn\,R_3}} - \sqrt{\frac{VDD - Vs}{Kp\,R_3}} = Vtp + Vtn \quad [4]$$

It is necessary to design the values of Kn, Kp and R$_3$ so as to be substantially large so that in case of KnxR$_3$ > V$_{DD}$ − Vs and KpxR$_3$ > V$_{DD}$ − Vs, $$Vs = Vtp + Vtn \quad [5]$$

"Vs" in formula [5] is able to be used as a reference voltage. Namely, in the normal manufacturing process of CMOS, the value of the sum of "Vtp and Tvn" is very stabilized in spite of the irregularity of "Vtp" and "Vtn". More specifically, the threshold voltage "Vt" of an MOS-transistor is as follows:

$$Vt = \phi_{ms} + \phi_b - \frac{Qox}{Cox} - \frac{Qb}{Cox} \quad [6]$$

$\phi$ms: work function from gate-metal to silicon;
$\phi$b: bend of energy band of strong inversion;
Cox: charge of surface and inner of oxide membrane;
Qb: depletion charge.

As to the irregularity of the values of "Vtp" and "Vtn", it seems that "Qox" has the most influence on the causes of irregularity. "Qox" is a charge which appears in the inner part of the oxide membrane and in the neighborhood of the influence between the silicon and oxide membranes, and "Qox" is generally positive in charge in a normal heat growth oxide membrane.

As to the values of "Vtp" and "Vtn" according to CMOS-construction, "Vtp" has negative polarity and "Vtn" has positive polarity with respect to the electric potential of a base plate. When "Qox" is increased by the irregularity in the manufacturing process, the value of "Vtp" is increased, and the value of "Vtn" is decreased. Similarly when "Qox" is decreased, the value of "Vtp" is decreased and the value of "Vtn" is increased. In the above noted case, the irregularity is caused in "Qox", and the sum of "Vtp" and "Vtn" cancels the amounts of change in "Vtp" and "Vtn" whereby it is understood that the reference voltage generating circuit is completely stabilized.

Referring now to the construction and operation of B-block and C-block diagrams:

The B-block diagram is a voltage comparing circuit composed of P-channel MOS-transistors 4 and 6 and N-channel MOS-transistors 5 and 7. The voltage comparing circuit has two input terminals, a gate terminal of P-channel MOS-transistor 4 as one input terminal is connected to the reference voltage generating point "a", and a gate terminal of P-channel MOS-transistor 6 as another input terminal is connected to the connection point "b" of the resistors 8 and 9.

The C-block diagram is a power source voltage dividing circuit composed of the resistors 8 and 9 connected in series, the electric potential "Vb" from the power source voltage "V$_{DD}$" at the connection point "b" is as follows:

$$Vb = R_8/R_8 + R_9) \times V_{DD} \quad [7]$$

R$_8$: resistance value of resistor 8;
R$_9$: resistance value of resistor 9.

According to the above noted formula [7], "Vb" is proportional to the power source voltage, whereby it is able to check the fluctuation of the power source voltage. Further it is possible to make the resistors 8 and 9 as a diffusion resistor of an IC-construction so that the resistance value thereof is designed by the sheet resistance value and geometrical dimension, and the temperature coefficients of the resistors, can be made equal whereby the irregularity of resistance ratio $R_8/(R_8+R_9)$ is not caused and the temperature coefficient is zero. Therefore, "Vb" enables the transmission of any voltage fluctuation according to a capacity change and temperature change.

Further referring now to the operation of the B and C-block diagrams of the present invention:

When the power source voltage drops to the value of battery life detecting voltage "Ej", i, e, $V_{DD}=Ej$, the electrical potential of point "b" is "Vbej", and the relation between "Vbej" and reference voltage "Vs" of the A-block diagram is as follows:

Vs = Vbej

Namely, the values of resistors 8 and 9 are designed so as to satisfy the following formula [8]:

$$Vtp + Vtn = (R_8/R_8+R_9) \times Ej \qquad [8]$$

According to the above noted design, the relation between the reference voltage "Vs" and "Vb" at the point "b" is as follows:

(1) In case of $V_{DD}>Ej$ ... Vs<Vb;
(2) In case of $V_{DD}=Ej$ ... Vs=Vb;
(3) In case of $V_{DD}<EJ$ ... Vs>Vb.

The relation of "Vb" and the output signals of the voltage comparing circuit in which reference voltage "Vs" is applied thereto as an input voltage is shown in TABLE-1 as follows:

| relation of two inputs | output logic level |
| --- | --- |
| Vs < Vb | "H" |
| Vs = Vb | "L" |
| Vs > Vb | "L" |

The output signal of the voltage comparing circuit becomes "H" level when the power source voltage "Vdd" is larger than the value "Ej" of the battery life detecting voltage, and the output signal of the voltage comparing circuit becomes "L" level when the power source voltage "$V_{DD}$" is equal to or smaller than the value "Ej" of the battery life detecting voltage whereby the output signal of the battery life detecting circuit is generated to the terminal "c".

According to the above noted circuit construction and operation explanation of the second embodiment of the present invention, the voltage detecting circuit is able to remarkably reduce the affects of irregularity in the IC-manufacturing process for the reference voltage generating circuit and power source dividing circuit, whereby it is not necessary to prepare the outer electric parts for adjusting thereof and further, the circuit of the present invention may be formed completely by IC-construction.

Further, in the actual circuit, a switching element is inserted in the circuit for reducing the power consumption so that the circuit is only operated when a pulse having a certain period is applied thereto.

Figure 7:
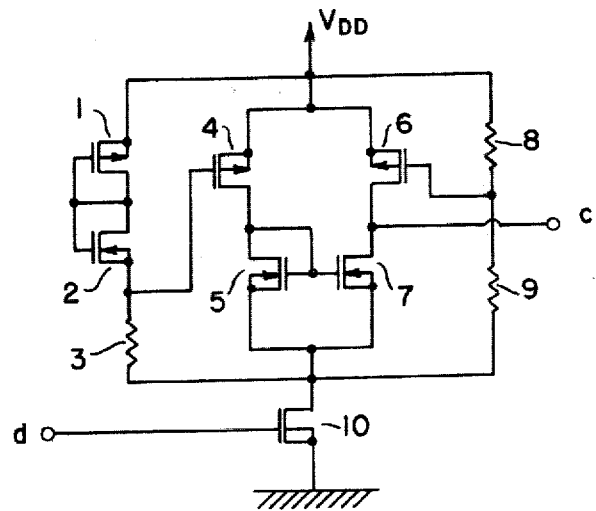
FIG. 7 shows another embodiment of the present invention wherein the A-block diagram is a reference voltage generating circuit, the B-block diagram is a voltage comparing circuit, and the C-block diagram is a power source voltage dividing circuit.

FIG. 7 shows a detailed circuit construction including the switching element as above noted, a switching operation being executed by N-channel MOS-transistor 10. The terminal "d" is a sampling pulse input terminal, and a sampling operation is executed when the sampling signal becomes "H" whereby it operates as the power source voltage detecting circuit.

According to the present invention, a power source voltage detecting circuit of non-adjusting type is easily obtained, it is able to reduce the adjusting cost of the circuit and to completely make the circuit by IC-construction and to easily design small electronic equipment. Further it is able to easily obtain a battery life detecting circuit which is able to be used for another electronic equipment except a watch.

What we claimed is:

1. In a detecting circuit for a power source voltage: a reference voltage generating circuit for generating a reference voltage; a voltage dividing circuit for dividing the power source voltage; and a voltage comparing circuit having one input terminal connected to receive the reference voltage from said reference voltage generating circuit and another input terminal connected to receive the divided voltage from said voltage dividing circuit; wherein said reference voltage generating circuit comprises at least two MOS-transistors having different threshold voltages and having the same polarity, one of said MOS-transistors having the gate thereof connected to the drain thereof and said drain being connected to the gate of the other MOS-transistor, the drain and source of said other MOS-transistor each being connected to a resistor, and the drain of said other MOS-transistor being connected to the one input terminal of said voltage comparing circuit, whereby the difference between the threshold voltages of said MOS-transistors is proportional to the reference voltage.

2. A detecting circuit according to claim 1 wherein said voltage dividing circuit comprises at least two connected together resistors with the connection point between the two resistors being connected to said another input terminal of said voltage comparing circuit.

3. In a detecting circuit for a power source voltage: a reference voltage generating circuit for generating a reference voltage; a voltage dividing circuit for dividing the power source voltage; and a voltage comparing circuit having one input terminal connected to receive the reference voltage from said reference voltage generating circuit and another input terminal connected to receive the divided voltage from said voltage dividing circuit; wherein said reference voltage generating circuit comprises a P-channel MOS-transistor having the drain thereof connected to the drain of said N-channel MOS-transistor and the gates of said P-channel and N-channel MOS-transistors being connected to the drains thereof respectively, one of the MOS-transistors being connected to one terminal of said power source, and the other of the MOS-transistors being connected to the one input terminal of said voltage comparing circuit.

4. A detecting circuit according to claim 3 wherein said voltage dividing circuit comprises at least two connected together resistors with the connection point between the two resistors being connected to said another input terminal of said voltage comparing circuit.

* * * * *